(12) United States Patent
Hong et al.

(10) Patent No.: US 12,581,724 B2
(45) Date of Patent: Mar. 17, 2026

(54) METHOD FOR MANUFACTURING SOURCE/DRAIN EPITAXIAL LAYER OF FDSOI MOSFET

(71) Applicant: Shanghai Huali Integrated Circuit Corporation, Shanghai (CN)

(72) Inventors: Jiaqi Hong, Shanghai (CN); Jun Tan, Shanghai (CN); Qiang Yan, Shanghai (CN)

(73) Assignee: Shanghai Huali Integrated Circuit Corporation, Shanghai (CN)

( * ) Notice: Subject to any disclaimer, the term of this patent is extended or adjusted under 35 U.S.C. 154(b) by 379 days.

(21) Appl. No.: 18/458,946

(22) Filed: Aug. 30, 2023

(65) Prior Publication Data

US 2024/0170344 A1    May 23, 2024

(30) Foreign Application Priority Data

Nov. 18, 2022    (CN) .......................... 202211443450.9

(51) Int. Cl.
| | |
|---|---|
| *H01L 21/762* | (2006.01) |
| *H10D 30/01* | (2025.01) |
| *H10D 30/67* | (2025.01) |
| *H10D 30/69* | (2025.01) |
| *H10D 84/01* | (2026.01) |
| *H10D 84/03* | (2025.01) |

(52) U.S. Cl.
CPC ..... *H10D 84/038* (2025.01); *H01L 21/76264* (2013.01); *H10D 30/031* (2025.01); *H10D 30/6748* (2025.01); *H10D 30/791* (2025.01); *H10D 84/0167* (2025.01); *H10D 84/0188* (2025.01)

(58) Field of Classification Search
CPC ......... H01L 21/76294; H01L 21/76278; H01L 21/76262; H01L 21/76248; H01L 21/02293; H01L 21/76264; H01L 21/7624; H10D 84/038; H10D 30/031; H10D 30/6748; H10D 30/791; H10D 84/0167; H10D 84/0188; H10D 30/0323; H10D 30/6713; H10D 30/797; H10D 62/822; H10D 62/832
See application file for complete search history.

(56) References Cited

U.S. PATENT DOCUMENTS

| | | | |
|---|---|---|---|
| 2007/0218659 A1* | 9/2007 | Spencer | H10D 86/201 |
| | | | 257/E21.633 |
| 2018/0190768 A1* | 7/2018 | Triyoso | H10D 30/791 |
| 2020/0043730 A1* | 2/2020 | Huang | H01L 21/02507 |

* cited by examiner

*Primary Examiner* — William B Partridge
*Assistant Examiner* — Erik A. Anderson

(57) ABSTRACT

The present application discloses a method for manufacturing a source/drain epitaxial layer of an FDSOI MOSFET, comprising: step 1, forming a shallow trench isolation on an FDSOI substrate; step 2, opening a formation region of a source/drain region of the MOSFET; step 3, performing first epitaxial growth to form a first pure silicon epitaxial layer; step 4, performing a first etching process to remove polysilicon particles generated from step 3; and step 5, performing epitaxial growth to sequentially form a second source/drain epitaxial seed layer, a third source/drain epitaxial bulk layer, and a fourth source/drain epitaxial cap layer on a surface of the first pure silicon epitaxial layer, so the four epitaxial layers are stacked to form the source/drain epitaxial layer.

10 Claims, 6 Drawing Sheets

Internal active region

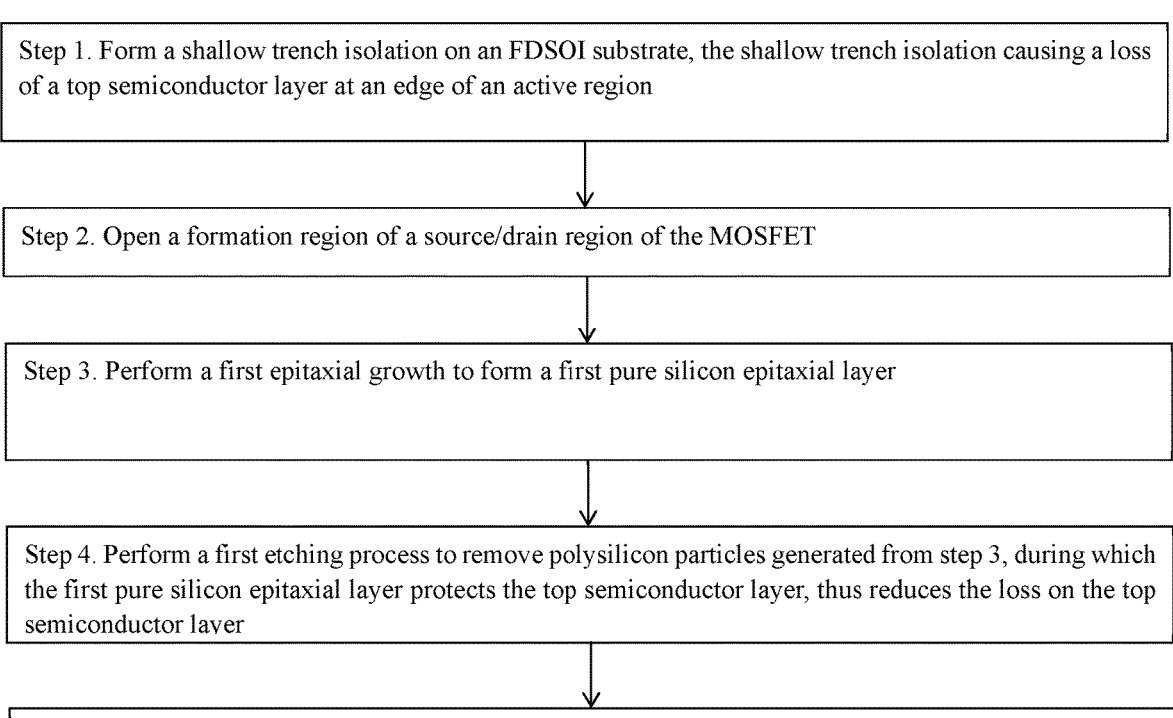

Step 1. Form a shallow trench isolation on an FDSOI substrate, the shallow trench isolation causing a loss of a top semiconductor layer at an edge of an active region Step 2. Open a formation region of a source/drain region of the MOSFET Step 3. Perform a first epitaxial growth to form a first pure silicon epitaxial layer Step 4. Perform a first etching process to remove polysilicon particles generated from step 3, during which the first pure silicon epitaxial layer protects the top semiconductor layer, thus reduces the loss on the top semiconductor layer Step 5. Perform epitaxial growth to sequentially form a second source/drain epitaxial seed layer, a third source/drain epitaxial bulk layer, and a fourth source/drain epitaxial cap layer on a surface of the first pure silicon epitaxial layer, which are stacked to form the source/drain epitaxial layer.

FIG. 2

METHOD FOR MANUFACTURING SOURCE/DRAIN EPITAXIAL LAYER OF FDSOI MOSFET

CROSS-REFERENCES TO RELATED APPLICATIONS

This application claims the priority to Chinese patent application No. 202211443450.9, filed on Nov. 18, 2022, and entitled "METHOD FOR MANUFACTURING SOURCE/DRAIN EPITAXIAL LAYER OF FDSOI MOSFET", the disclosure of which is incorporated herein by reference in entirety.

TECHNICAL FIELD

The present application relates to a method for manufacturing a semiconductor integrated circuit, in particular to a method for manufacturing a source/drain epitaxial layer of a fully depleted silicon-on-insulator (FDSOI) MOSFET.

BACKGROUND

A germanium/silicon epitaxy technology has been applied in a source/drain region of an FDSOI PMOS device to improve the hole mobility and saturation current. In the early stage of this process, a germanium/silicon non-growth phenomenon at a certain level often occurred at the boundary of the shallow trench isolation area (STI), i.e., which generated a germanium/silicon shrinkage, causing a subsequent contact (CT) puncture in very severe cases, seriously affecting yield.

FIGS. 1A-1B are schematic diagrams of device structures obtained at various steps of an existing method for manufacturing a source/drain epitaxial layer of an FDSOI PMOS. The existing source/drain epitaxial layer of the FDSOI PMOS is typically formed using germanium and silicon materials. The existing method for manufacturing a source/drain epitaxial layer of an FDSOI PMOS includes the following steps:

Step 1. Referring to FIG. 1A, an FDSOI substrate is provided, the FDSOI substrate includes a bottom silicon layer 101, a silicon oxide buried layer 102, and a top silicon layer 103, and the silicon oxide buried layer 102 being located between the bottom silicon layer 101 and the top silicon layer 103.

A shallow trench isolation 104 is formed on the FDSOI substrate, the shallow trench isolation 104 defines an active region, and the shallow trench isolation 104 causes a loss of the top silicon layer 103 at an edge of the active region. The thickness of the top silicon layer 103 in the region represented by the dashed-line ovaloval 106 is reduced, indicating that the loss of the top silicon layer 103 occurred.

Step 2. Referring to FIG. 1A, a formation region of a source/drain region of the PMOS is opened. A region shown in FIG. 1A is the formation region of the source/drain region of the PMOS.

Step 3. Referring to FIG. 1B, epitaxial growth is performed to sequentially form a source/drain germanium/silicon epitaxial seed layer 105a, a source/drain germanium/silicon epitaxial bulk layer 105b105b, and a source/drain germanium/silicon epitaxial cap layer 105c, the source/drain germanium/silicon epitaxial seed layer 105a, the source/drain germanium/silicon epitaxial bulk layer 105b105b, and the source/drain germanium/silicon epitaxial cap layer 105c are stacked to form a source/drain epitaxial layer 105.

In the existing method, a process flow of step 3 to step 5 may be represented as:

S1, Dep L1: low Ge/B (germanium and boron) concentration seed layer;

S2, Dep L2: high Ge/B concentration bulk layer; and

S3, Dep L3: no Ge/high B concentration cap layer.

Dep represents a deposition process, i.e., an epitaxial growth process, the seed layer represents the source/drain germanium/silicon epitaxial seed layer 105a, the bulk layer represents the source/drain germanium/silicon epitaxial bulk layer 105b, and the cap layer represents the source/drain germanium/silicon epitaxial cap layer 105c. Moreover, L1, L2, and L3 represent the three stacked layers of the source/drain epitaxial layer 105, which also correspond to the source/drain germanium/silicon epitaxial seed layer 105a, the source/drain germanium/silicon epitaxial bulk layer 105b, and the source/drain germanium/silicon epitaxial cap layer 105c, respectively.

Dep L1 represents the growth of a first epitaxial layer, i.e., the source/drain germanium/silicon epitaxial seed layer 105a, Dep L2 represents the growth of a second epitaxial layer, i.e., the source/drain germanium/silicon epitaxial bulk layer 105b, and Dep L3 represents the growth of a third epitaxial layer, i.e., the source/drain germanium/silicon epitaxial cap layer 105c.

Doping concentrations of gemanium (Ge) and boron (B) are defined by high and low concentrations, respectively. A corresponding high doping concentration is greater than a corresponding low doping concentration. As B doping is P-type doping, a high B concentration represents P+ doping.

The low Ge/B concentration seed layer indicates that Ge and B doping concentrations of the source/drain germanium/silicon epitaxial seed layer 105a are both relatively low.

The high Ge/B concentration bulk layer indicates that Ge and B doping concentrations of the source/drain germanium/silicon epitaxial bulk layer 105b are both relatively high.

The no Ge/high B concentration cap layer indicates that the source/drain germanium/silicon epitaxial cap layer 105c includes no Ge and a high B doping concentration.

The existing method is prone to a germanium/silicon shrinkage defect, as shown in a dashed-line oval 107. The source/drain epitaxial layer 105 is not formed in a region of the dashed-line oval 107, and the width of the shrinkage is represented by d101. A reduction in the dimension of the source/drain epitaxial layer 105 affects the performance of the device. Moreover, when a contact is formed at the top of the source/drain region, the contact is easy to penetrate through the silicon oxide buried layer 102 in the region of the dashed-line oval 107.

From a comparison with FIG. 1A, it can be seen that the region corresponding to the dashed-line oval 107 in FIG. 1B is related to the loss of the top silicon layer 103 in the region represented by the dashed-line oval 106 in FIG. 1B. Moreover, during implementing of Dep L1, from the Ge and B doping in the source/drain germanium/silicon epitaxial seed layer 105a, an etching effect is significant, and the silicon material in the region represented by the dashed-line oval 106 in FIG. 1A is prone to a further full loss. As such, the bottom silicon oxide buried layer 102 is fully exposed, while the source/drain germanium/silicon epitaxial seed layer 105a cannot be grown on a surface of the silicon oxide buried layer 102, and therefore a shrinkage region represented by the dashed-line oval 107 in FIG. 1B is obtained.

After experiments, by examining a pre-layer that, it was found when germanium/silicon epitaxy is to be performed, a surface Si loss near the STI boundary is maximum, leaving surface Si with a minimum thickness and maximum defects, which is not conducive to the initial germanium/silicon growth. Referring to FIG. 4A, which is a SEM/TEM image corresponding to FIG. 1A, in FIG. 4A, a bottom silicon layer is represented by a mark label 101*a* separately, the silicon oxide buried layer is represented by a label 102*a* separately, a top silicon layer is represented by a label 103*a* separately, and the shallow trench isolation is represented by a label 104*a* separately. A dashed-line oval 106*a* corresponds to an edge region of the active region, which corresponds to the region of the dashed-line oval 106 in FIG. 1A. It can be seen that there is a loss in the thickness of the top silicon layer 103*a* in the dashed-line oval 106*a*.

In addition, an existing germanium/silicon growth method includes three layers, i.e., seed, bulk, and cap layers. The first seed layer is doped with Ge/B, with relatively more etching gas being introduced, which may further aggravate the surface Si loss near the STI boundary, resulting in the disablement of seed layer growth and subsequent bulk and cap growth.

Referring to FIG. 4B, which is a SEM/TEM image corresponding to FIG. 1B, a source/drain epitaxial layer is represented by a label 105*a* separately, and a dashed-line oval 107*a* relates to the dashed-line oval 107 in FIG. 1B. It can be seen that no source/drain epitaxial layer 105*a* is formed in the dashed-line oval 107*a*, that is, the source/drain epitaxial layer 105*a* has undergone a shrinkage.

BRIEF SUMMARY

According to some embodiments in this application, a method for manufacturing a source/drain epitaxial layer of an FDSOI MOSFET is disclosed in the following steps:

step 1, providing an FDSOI substrate, wherein the FDSOI substrate comprises a bottom semiconductor layer, an insulating dielectric buried layer, and a top semiconductor layer, wherein the insulating dielectric buried layer is disposed between the bottom semiconductor layer and the top semiconductor layer; and forming a shallow trench isolation on the FDSOI substrate, wherein the shallow trench isolation defines an active region;

wherein after the shallow trench isolation is formed, a thickness of the top semiconductor layer at the edge of the active region is less than a thickness of the internal region of the active region;

step 2, opening a formation region of a source/drain region of the MOSFET;

step 3, performing a first epitaxial growth, wherein the first epitaxial growth forms a first pure silicon epitaxial layer, wherein the first pure silicon epitaxial layer is stacked on a surface of the top semiconductor layer in the formation region of the source/drain region of the MOSFET, wherein the first pure silicon epitaxial layer is an undoped pure silicon structure;

wherein polysilicon particles are generated on a surface of the shallow trench isolation outside the top semiconductor layer; wherein a thickness of the first pure silicon epitaxial layer at the edge of the active region is greater than a thickness of the internal region of the active region, a thickness of a superposition layer on the top semiconductor layer and the first pure silicon epitaxial layer are uniform, and the top surface of the first pure silicon epitaxial layer is flat;

step 4, performing a first etching process to remove the polysilicon particles; and step 5, performing a second, a third and a fourth epitaxial growths sequentially, wherein the second epitaxial growth forms a second source/drain epitaxial seed layer, the third epitaxial growth forms a third source/drain epitaxial bulk layer, and the fourth epitaxial growth forms a fourth source/drain epitaxial cap layer, wherein the first pure silicon epitaxial layer, the second source/drain epitaxial seed layer, the third source/drain epitaxial bulk layer, and the fourth source/drain epitaxial cap layer are stacked to form the source/drain epitaxial layer; wherein the second source/drain epitaxial seed layer is formed on a surface of the first pure silicon epitaxial layer, wherein the second source/drain epitaxial seed layer is continuous at an edge of the active region without the loss of the top semiconductor layer under a protection of the first pure silicon epitaxial layer.

In some cases, a material of the bottom semiconductor layer includes silicon or germanium.

In some cases, a material of the insulating dielectric buried layer includes silicon oxide or a high dielectric constant material.

In some cases, a material of the top semiconductor layer includes silicon or germanium.

In some cases, in step 2, the MOSFET includes a PMOS, and the opened region is a formation region of a source/drain region of the PMOS.

In some cases, a first gate structure of the PMOS is formed on the FDSOI substrate before step 2.

In step 2, the formation region of the PMOS is fully opened, and the source/drain region of the PMOS is formed on two sides of the first gate structure in a self-aligned manner.

In some cases, the thickness of the first pure silicon epitaxial layer in step 3 is in a range of 10 Å-20 Å.

In some cases, a spacer is also formed on a side face of the first gate structure, a hard mask layer is formed on a top surface of the first gate structure, and the polysilicon particles are also formed on surfaces of the spacer and the hard mask layer.

In some cases, during the first etching process in step 4, an etching rate on the polysilicon particles is greater than an etching rate on the first pure silicon epitaxial layer.

In some cases, the second source/drain epitaxial seed layer is a boron-doped germanium/silicon epitaxial layer, the third source/drain epitaxial bulk layer is a boron-doped germanium/silicon epitaxial layer, and the fourth source/drain epitaxial cap layer is a boron-doped silicon epitaxial layer.

A germanium doping concentration of the third source/drain epitaxial bulk layer is greater than a germanium doping concentration of the second source/drain epitaxial seed layer.

A boron doping concentration of the third source/drain epitaxial bulk layer is greater than a boron doping concentration of the second source/drain epitaxial seed layer.

A boron doping concentration of the fourth source/drain epitaxial cap layer is greater than the boron doping concentration of the second source/drain epitaxial seed layer.

The boron doping concentration of the third source/drain epitaxial bulk layer and the boron doping concentration of the fourth source/drain epitaxial cap layer are both high doping concentrations.

In some cases, boron doping in the second source/drain epitaxial seed layer, the third source/drain epitaxial bulk layer, and the fourth source/drain epitaxial cap layer is formed by in-situ doping.

In some cases, a pressure of the first epitaxial growth in step 3 is greater than a pressure of the epitaxial growth in step 5 for forming the second source/drain epitaxial seed layer, the third source/drain epitaxial bulk layer, and the fourth source/drain epitaxial cap layer.

In some cases, the first gate structure includes a gate dielectric layer and a gate conductive material layer that are stacked sequentially.

In an existing method, a source/drain epitaxial layer is formed by directly forming a source/drain epitaxial seed layer, a source/drain epitaxial bulk layer, and a source/drain epitaxial cap layer after a source/drain region of a MOSFET is opened. Different from existing method, before forming the second source/drain epitaxial seed layer, the present application further includes forming the first pure silicon epitaxial layer and performing the first etching process to remove the polysilicon particles that are formed at the same time as the first pure silicon epitaxial layer and located on a surface of a dielectric layer outside the source/drain region, e.g., the shallow trench isolation. Herein etching effects of epitaxial growth processes of the first pure silicon epitaxial layer and the second source/drain epitaxial seed layer are different from the existing etching effects. As the etching effect of the first pure silicon epitaxial growth process is weaker than the etching effect of the second source/drain epitaxial growth process, the less aggressive etching effect of the first epitaxial growth of the present application may reduce therefore repair the loss of the top semiconductor layer, thereby ensuring that the second source/drain epitaxial seed layer presents a uniform and continuous structure with a full even layer in the formation region of the source/drain region. Since the third source/drain epitaxial bulk layer and the fourth source/drain epitaxial cap layer may be formed only on a surface of the second source/drain epitaxial seed layer and may not be formed on a surface outside the second source/drain epitaxial seed layer, after a surface area of the second source/drain epitaxial seed layer is increased, the area of the entire source/drain epitaxial layer is increased rather than reduced. In the present application, after the area of the source/drain epitaxial layer is increased, a stress effect of the source/drain epitaxial layer on a channel region may be enhanced, thus improving carrier mobility of the channel region and ultimately improving device performance.

BRIEF DESCRIPTION OF THE DRAWINGS

The present application will be further described in detail below with reference to the drawings and specific implementations:

FIG. 2 is a flow chart of a method for manufacturing a source/drain epitaxial layer of an FDSOI MOSFET according to an embodiment of the present application.

DETAILED DESCRIPTION OF THE DISCLOSURE

Figure 1A:
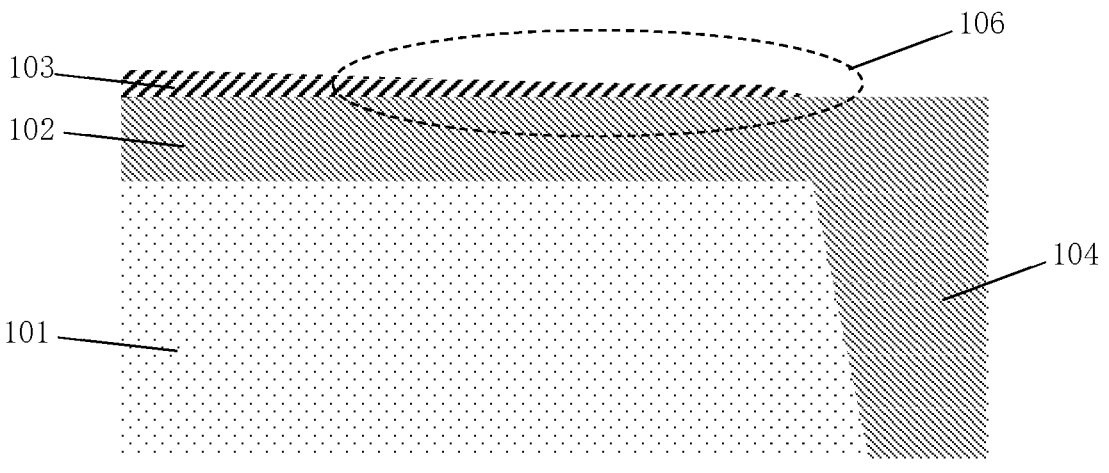
FIGS. 1A-1B are schematic diagrams of device structures obtained in various steps of an existing method for manufacturing a source/drain epitaxial layer of an FDSOI PMOS.
Figure 1B:
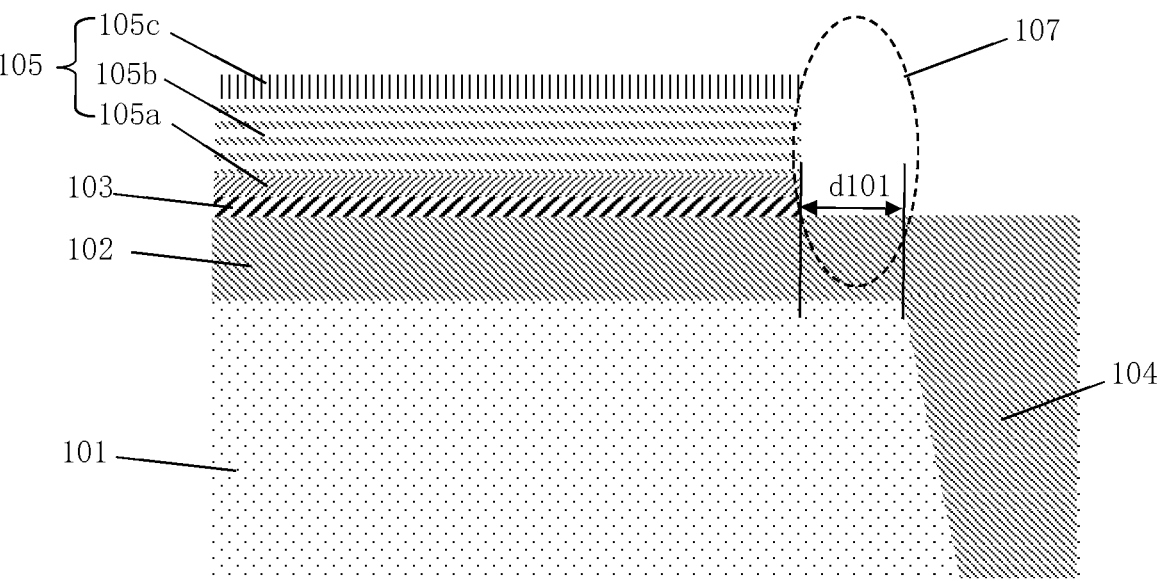
Figure 3A:
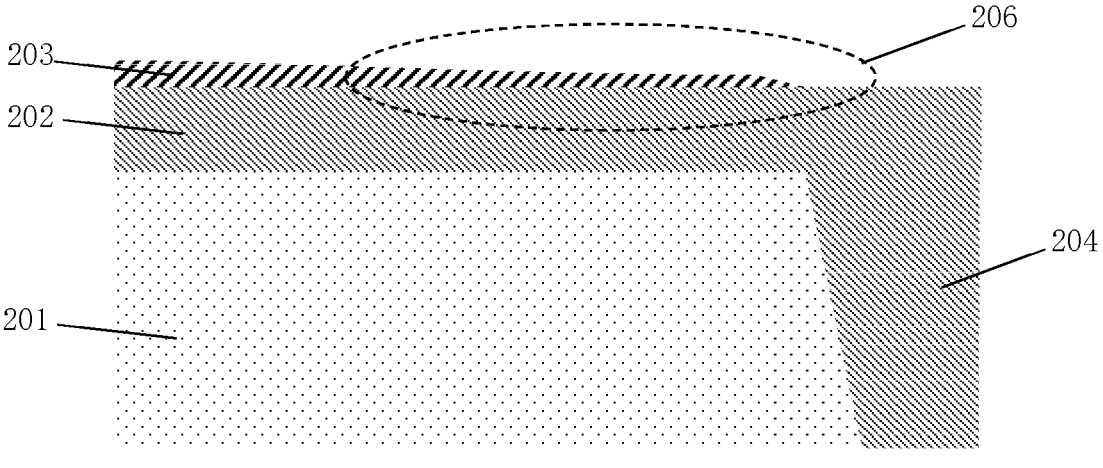
FIGS. 3A-3D are schematic diagrams of device structures obtained at various steps of the method for manufacturing a source/drain epitaxial layer of an FDSOI MOSFET according to an embodiment of the present application.

FIG. 2 is a flow diagram of a method for manufacturing a source/drain epitaxial layer 205 of an FDSOI MOSFET according to this embodiment of the present application. FIGS. 3A-3D are schematic diagrams of device structures obtained at various steps of the method for manufacturing the source/drain epitaxial layer 205 of the FDSOI MOSFET according to this embodiment of the present application. The method for manufacturing the source/drain epitaxial layer 205 of the FDSOI MOSFET according to this embodiment of the present application includes the following steps:

Step 1. Referring to FIG. 3A, an FDSOI substrate is provided, the FDSOI substrate including a bottom semiconductor layer 201, an insulating dielectric buried layer 202, and a top semiconductor layer 203, and the insulating dielectric buried layer 202 being located between the bottom semiconductor layer 201 and the top semiconductor layer 203.

A shallow trench isolation 204 is formed on the FDSOI substrate, the shallow trench isolation 204 defines an active region, and the shallow trench isolation 204 causes a loss of top semiconductor layer 203 at an edge of the active region. The thickness of the top semiconductor layer 203 in a region represented by a dashed-line oval 206 is reduced, indicating that the loss of the top semiconductor layer 203 occurs.

In this embodiment of the present application, a material of the bottom semiconductor layer 201 is silicon. In other embodiments, the material of the bottom semiconductor layer 201 may also be germanium/silicon or germanium.

A material of the insulating medium buried layer 202 is silicon oxide. In other embodiments, the material of the insulating dielectric buried layer 202 may also include other dielectric layers, such as a high dielectric constant material.

A material of the top semiconductor layer 203 is silicon. In other embodiments, the material of the top semiconductor layer 203 may also be germanium/silicon or germanium.

Step 2. Referring to FIG. 3A, which shows an opened formation region of a source/drain region of the MOSFET.

In this embodiment of the present application, the MOSFET includes a PMOS, and the opened region is a formation region of a source/drain region of the PMOS.

A first gate structure (not shown) of the PMOS is formed on the FDSOI substrate before step 2.

The first gate structure includes a gate dielectric layer and a gate conductive material layer that are stacked sequentially.

The formation region of the PMOS is fully opened, and the source/drain region of the PMOS is formed on two sides of the first gate structure in a self-aligned manner.

A spacer (not shown) is also formed on a side face of the first gate structure, a hard mask layer (not shown) is formed on a top surface of the first gate structure.

Figure 3B:
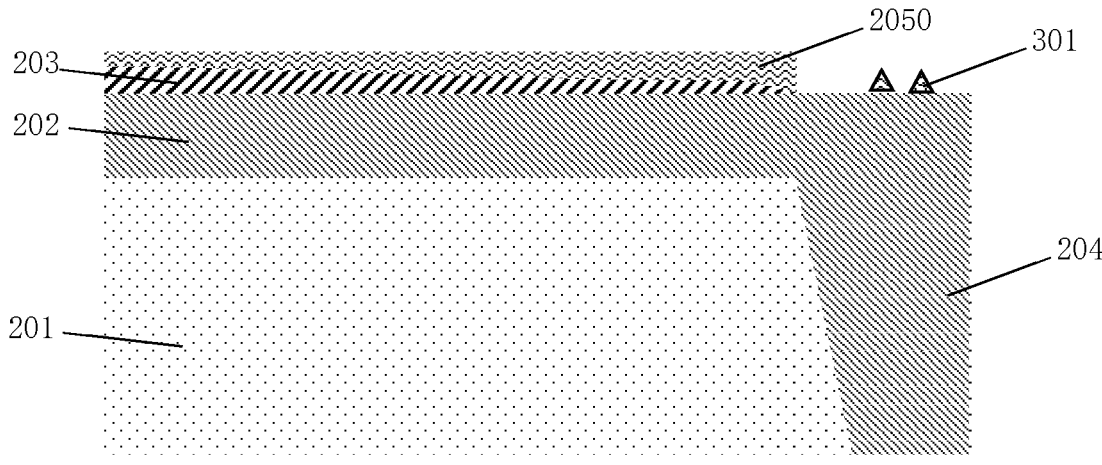

Step 3. Referring to FIG. 3B, first epitaxial growth is performed to form a first pure silicon epitaxial layer 2050, the first pure silicon epitaxial layer 2050 is stacked on a surface of the top semiconductor layer 203 in the formation region of the source/drain region of the MOSFET, the first pure silicon epitaxial layer 2050 is a non-doped pure silicon structure, the pure silicon structure reduces an etching effect of the first epitaxial growth and thus repairs the loss of the top semiconductor layer 203. The first pure silicon epitaxial layer are uniform, and the top surface of the first pure silicon epitaxial layer is flat. Herein the weakening of the etching effect of the first epitaxial growth generates some polysilicon particles 301 on a surface of the shallow trench isolation 204 outside the top semiconductor layer 203.

In this embodiment of the present application, the thickness of the first pure silicon epitaxial layer 2050 is in a range of 10 Å-20 Å.

The polysilicon particles 301 are also formed on surfaces of the spacer and the hard mask layer.

Figure 3C:
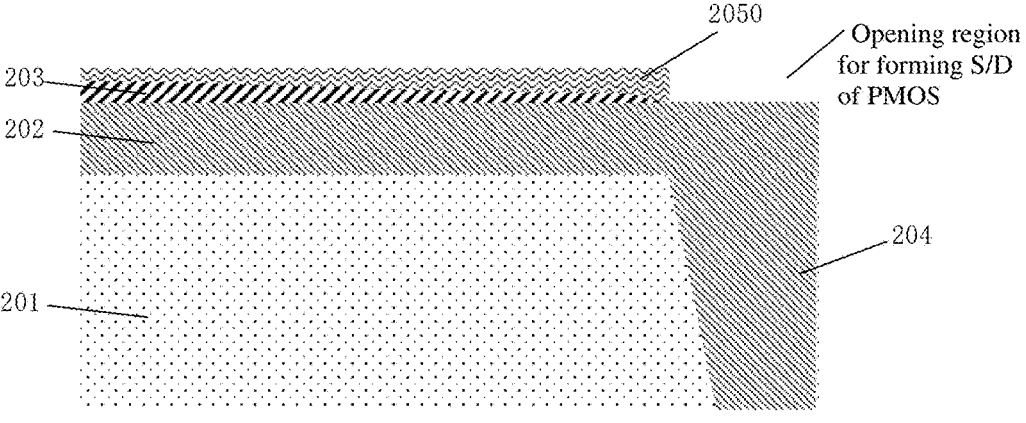

Step 4. Referring to FIG. 3C, performing a first etching process to remove the polysilicon particles 301.

In this embodiment of the present application, due to different lattice structures of polysilicon and monocrystalline silicon formed by epitaxy, during the first etching process, an etching rate on the polysilicon particles 301 is typically much greater than an etching rate on the first pure silicon epitaxial layer 2050.

Figure 3D:
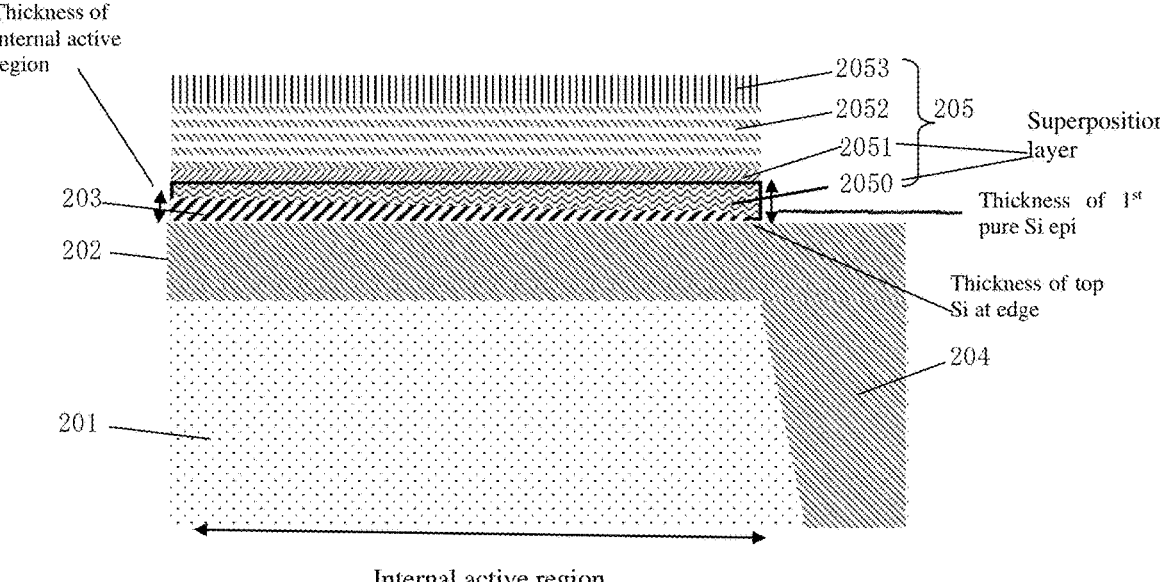

Step 5. Referring to FIG. 3D, epitaxial growth is performed to sequentially form a second epi-layer—the source/drain epitaxial seed layer 2051, a third epilayer—the source/drain epitaxial bulk layer 2052, and a fourth epi-layer—the source/drain epitaxial cap layer 2053, the three epi-layers—the first pure silicon epitaxial layer 2050, the second source/drain epitaxial seed layer 2051, the third source/drain epitaxial bulk layer 2052, and the fourth source/drain epitaxial cap layer 2053 are stacked to form the source/drain epitaxial layer 205.

The second source/drain epitaxial seed layer 2051 is formed on a surface of the first pure silicon epitaxial layer 2050, and due to a characteristic of the loss of the top semiconductor layer 203 being repaired by the first pure silicon epitaxial layer 2050, the second source/drain epitaxial seed layer 2051 is continuous at the edge of the active region and therefore the source drain epitaxial layer 205 is continuous at the edge of the active region.

In this embodiment of the present application, the second source/drain epitaxial seed layer 2051 is a boron-doped germanium/silicon epitaxial layer, the third source/drain epitaxial bulk layer 2052 is a boron-doped germanium/silicon epitaxial layer, and the fourth source/drain epitaxial cap layer 2053 is a boron-doped silicon epitaxial layer.

A germanium doping concentration of the third source/drain epitaxial bulk layer 2052 is greater than a germanium doping concentration of the second source/drain epitaxial seed layer 2051.

A boron doping concentration of the third source/drain epitaxial bulk layer 2052 is greater than a boron doping concentration of the second source/drain epitaxial seed layer 2051.

A boron doping concentration of the fourth source/drain epitaxial cap layer 2053 is greater than the boron doping concentration of the second source/drain epitaxial seed layer 2051.

The boron doping concentration of the third source/drain epitaxial bulk layer 2052 and the boron doping concentration of the fourth source/drain epitaxial cap layer 2053 are both high doping concentrations.

Boron doping in the second source/drain epitaxial seed layer 2051, the third source/drain epitaxial bulk layer 2052, and the fourth source/drain epitaxial cap layer 2053 is formed by in-situ doping.

A pressure of the first epitaxial growth in step 3 is greater than a pressure of the epitaxial growth in step 5 for forming the second source/drain epitaxial seed layer 2051, the third source/drain epitaxial bulk layer 2052, and the fourth source/drain epitaxial cap layer 2053. The first epitaxial growth is formed by a high pressure process.

In an existing method, a source/drain epitaxial layer is formed by directly forming a source/drain epitaxial seed layer, a source/drain epitaxial bulk layer, and a source/drain epitaxial cap layer after a source/drain region of a MOSFET is opened. Different from existing method, before forming the second source/drain epitaxial seed layer 2051, this embodiment of the present application further includes forming the first pure silicon epitaxial layer 2050 and performing the first etching process to remove the polysilicon particles 301 that are formed at the same time as the first pure silicon epitaxial layer 2050 and located on a surface of a dielectric layer outside the source/drain region, e.g., the shallow trench isolation 204. Etching effects of epitaxial growth processes of the first pure silicon epitaxial layer 2050 and the second source/drain epitaxial seed layer 2051 are different. Based on the characteristic of the etching effect of the first epitaxial growth process for forming the first pure silicon epitaxial layer 2050 being weaker than the etching effect of the epitaxial growth process for forming the second source/drain epitaxial seed layer 2051, by weakening the etching effect of the first epitaxial growth, this embodiment of the present application can ensure that the first epitaxial growth may repair the loss of the top semiconductor layer 203 rather than causing a loss of the top semiconductor layer 203, thereby ensuring that the second source/drain epitaxial seed layer 2051 presents a continuous structure and has a maximum area in the formation region of the source/drain region. Since the third source/drain epitaxial bulk layer 2052 and the fourth source/drain epitaxial cap layer 2053 may be formed only on a surface of the second source/drain epitaxial seed layer 2051 and may not be formed on a surface outside the second source/drain epitaxial seed layer 2051, after a surface area of the second source/drain epitaxial seed layer is increased, the area of the entire source/drain epitaxial layer 205 is increased rather than reduced. In this embodiment of the present application, after the area of the source/drain epitaxial layer 205 is increased, a stress effect of the source/drain epitaxial layer 205 on a channel region may be enhanced, thus improving carrier mobility of the channel region and ultimately improving device performance.

In this embodiment of the present application, a process flow of step 3 to step 5 may be represented as:

S1, Dep L0: pure Si repair layer;

S2, Etch: removal of PA on the dielectric layer that may be brought by L0;

S3, Dep L1: low Ge/B concentration seed layer;

S4, Dep L2: high Ge/B concentration bulk layer; and

S5, Dep L3: no Ge/high B concentration cap layer.

Dep represents a deposition process, i.e., an epitaxial growth process, and Etch represents an etching process. The pure Si repair layer represents the first pure silicon epitaxial layer 2050, PA represents the polysilicon particles 301, the seed layer represents the second source/drain epitaxial seed layer 2051, the bulk layer represents the third source/drain epitaxial bulk layer 2052, and the cap layer represents the fourth source/drain epitaxial cap layer 2053. Moreover, L0, L1, L2, and L3 are used to represent the four stacked layers of the source/drain epitaxial layer 205, which also correspond to the second source/drain epitaxial seed layer 2051, the third source/drain epitaxial bulk layer 2052, and the fourth source/drain epitaxial cap layer 2053, respectively.

Dep L0 represents the growth of a first epitaxial layer, i.e. the first pure silicon epitaxial layer 2050, which is the first epitaxial growth, Dep L1 represents the growth of a second epitaxial layer, i.e., the second source/drain epitaxial seed layer 2051, Dep L2 represents the growth of a third epitaxial layer, i.e., the third source/drain epitaxial bulk layer 2052, and Dep L3 represents the growth of a fourth epitaxial layer, i.e., the fourth source/drain epitaxial cap layer 2053.

Doping concentrations of Ge and B are defined by high and low concentrations, respectively. A corresponding high doping concentration is greater than a corresponding low doping concentration. As B doping is P-type doping, a high B concentration represents P+ doping.

The low Ge/B concentration seed layer indicates that Ge and B doping concentrations of the source/drain germanium/silicon epitaxial seed layer 2051 are both relatively low.

The high Ge/B concentration bulk layer indicates that Ge and B doping concentrations of the source/drain germanium/silicon epitaxial bulk layer 2052 are both relatively high.

The no Ge/high B concentration cap layer indicates that the source/drain germanium/silicon epitaxial cap layer 2053 includes no Ge and a high B doping concentration.

In the method of this embodiment of the present application, a germanium/silicon growth method may be referred to as a DED method for short, where the first D represents a first letter D of Dep in step S1, the second E represents a first letter E of Etch in step S2, and the third D represents a first letter D of Dep in steps S3-S5. In the DED germanium/silicon growth method:

In step S1, a L0 pure Si layer of 10-20 Å is grown using a high pressure process, so as to compensate for a SOI loss on a wafer surface, particularly at an STI boundary, and repair a surface Si damage, thereby facilitating subsequent germanium/silicon growth.

In step S2, since a small amount of an etching gas is introduced during the growth of the L0 pure Si layer, some particles (PA) may be formed on the dielectric layer, such as the spacer, and therefore a following Etch step is required to remove the particles that may be brought by the growth of the L0 pure Si layer, based on the characteristic of the etching rate of the Si particles on the dielectric surface being much greater than the etching rate of monocrystalline silicon.

Steps S3-S5 continue to grow L1-L3 layers, i.e., the seed, bulk, and cap layers.

The method of this embodiment of the present application can improve the germanium/silicon shrinkage at the STI boundary and improve the device performance.

Figure 4A:
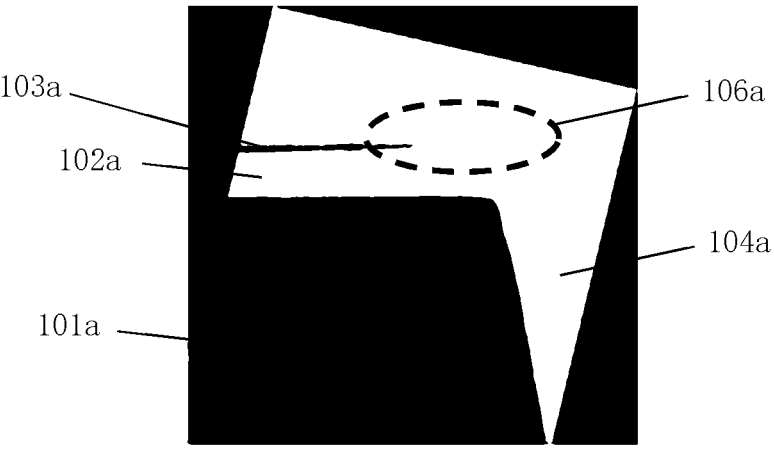
FIG. 4A is a SEM/TEM image corresponding to FIG. 1A from the existing method.
Figure 4B:
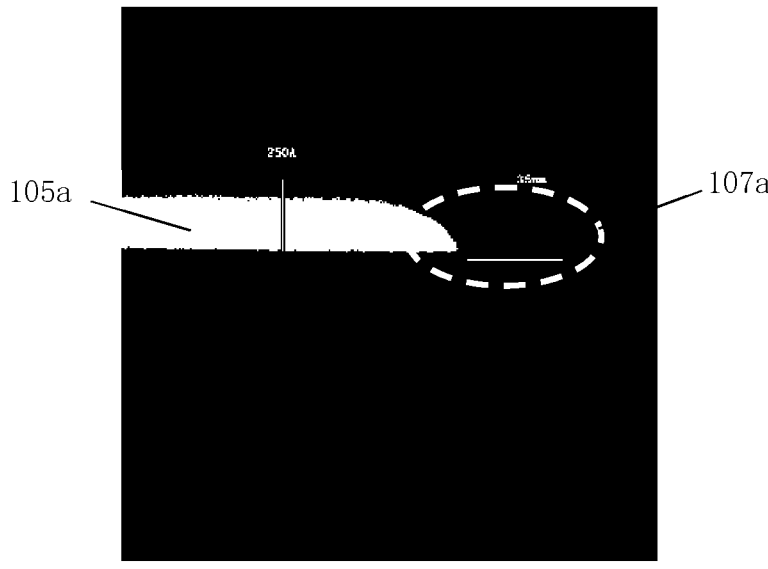
FIG. 4B is a SEM/TEM image corresponding to FIG. 1B from the existing method.
Figure 4C:
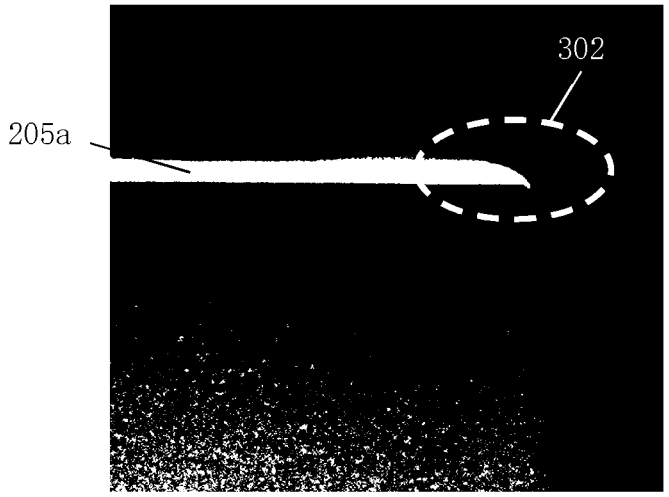
FIG. 4C is a SEM/TEM image corresponding to FIGS. 3A-3D according to the embodiment of the present application.

Referring to FIG. 4C, which is a SEM/TEM image from a similar structure corresponding to FIG. 3D, the source/drain epitaxial layer is represented by a label 205a separately, and a dashed-line oval 302 corresponds to an edge region of the active region. It can be seen that the source/drain epitaxial layer 205a is formed in the dashed-line oval 302. Therefore, compared to FIG. 4B from an existing method, the source/drain epitaxial layer 205a in FIG. 4C formed by the method of this embodiment of the present application does not shrink, shown as the source drain/epitaxial layer 205a being thicker and having a larger volume for protection under etching.

The present application is described in detail above via specific embodiments, but these embodiments are not intended to limit the present application. Without departing from the principle of the present application, those skilled in the art can still make many variations and improvements, which should also be construed as falling into the protection scope of the present application.

What is claimed is:

1. A method for manufacturing a source/drain epitaxial layer of a MOSFET on a fully depleted silicon-on-insulator (FDSOI), comprising:

step 1, providing an FDSOI substrate, wherein the FDSOI substrate comprises a bottom semiconductor layer, an insulating dielectric buried layer, and a top semiconductor layer, wherein the insulating dielectric buried layer is disposed between the bottom semiconductor layer and the top semiconductor layer; and forming a shallow trench isolation on the FDSOI substrate, wherein a border of the shallow trench isolation defines an edge of an active region, wherein after the shallow trench isolation is formed, a thickness of the top semiconductor layer at the edge of the active region is less than a thickness of an internal region of the active region;

step 2, opening a formation region of a source/drain region of the MOSFET;

step 3, performing a first epitaxial growth, wherein the first epitaxial growth forms a pure silicon epitaxial layer, wherein the pure silicon epitaxial layer is stacked on a surface of the top semiconductor layer in the formation region of the source/drain region of the MOSFET, wherein the pure silicon epitaxial layer is an undoped pure silicon structure, wherein polysilicon particles are generated on a surface of the shallow trench isolation outside the top semiconductor layer, wherein a thickness of the pure silicon epitaxial layer at the edge of the active region is greater than the thickness of the internal region of the active region, a thickness of a superposition layer comprising the top semiconductor layer and the pure silicon epitaxial layer is uniform, and a top surface of the pure silicon epitaxial layer is flat;

step 4, performing a first etching process to remove the polysilicon particles; and step 5, performing a second, a third, and a fourth epitaxial growth sequentially, wherein the second epitaxial growth forms a source/drain epitaxial seed layer, the third epitaxial growth forms a source/drain epitaxial bulk layer, and the fourth epitaxial growth forms a source/drain epitaxial cap layer, wherein the pure silicon epitaxial layer, the source/drain epitaxial seed layer, the source/drain epitaxial bulk layer, and the source/drain epitaxial cap layer are stacked to form the source/drain epitaxial layer, wherein the source/drain epitaxial seed layer is formed on a surface of the pure silicon epitaxial layer, wherein the source/drain epitaxial seed layer is continuous on the pure silicon epitaxial layer to the edge of the active region.

2. The method for manufacturing the source/drain epitaxial layer of the MOSFET on the FDSOI according to claim 1, wherein a material of the bottom semiconductor layer comprises silicon or germanium.

3. The method for manufacturing the source/drain epitaxial layer of the MOSFET on the FDSOI according to claim 1, wherein a material of the insulating dielectric buried layer comprises silicon oxide or a high dielectric constant material.

4. The method for manufacturing the source/drain epitaxial layer of the MOSFET on the FDSOI according to claim 1, wherein a material of the top semiconductor layer comprises silicon or germanium.

5. The method for manufacturing the source/drain epitaxial layer of the MOSFET on the FDSOI according to claim 1, wherein in step 2, the MOSFET comprises a PMOS, and the opened formation region is the source/drain region of the PMOS.

6. The method for manufacturing the source/drain epitaxial layer of the MOSFET on the FDSOI according to claim 5, wherein a thickness of the pure silicon epitaxial layer in step 3 is in a range of 10 Å-20 Å.

7. The method for manufacturing the source/drain epitaxial layer of the MOSFET on the FDSOI according to claim 1, wherein during the first etching process in step 4, an etching rate on the polysilicon particles is greater than an etching rate on the pure silicon epitaxial layer.

8. The method for manufacturing the source/drain epitaxial layer of the MOSFET on the FDSOI according to claim 5, wherein the source/drain epitaxial seed layer is a boron-doped germanium/silicon epitaxial layer, wherein the source/drain epitaxial bulk layer is a boron-doped germanium/silicon epitaxial layer, and wherein the source/drain epitaxial cap layer is a boron-doped silicon epitaxial layer;

wherein a germanium doping concentration of the source/drain epitaxial bulk layer is greater than a germanium doping concentration of the source/drain epitaxial seed layer;

wherein a boron doping concentration of the source/drain epitaxial bulk layer is greater than a boron doping concentration of the second source/drain epitaxial seed layer;

wherein a boron doping concentration of the source/drain epitaxial cap layer is greater than the boron doping concentration of the source/drain epitaxial seed layer; and wherein the boron doping concentration of the source/drain epitaxial bulk layer and the boron doping concentration of the source/drain epitaxial cap layer are both high doping concentrations.

9. The method for manufacturing the source/drain epitaxial layer of the MOSFET on the FDSOI according to claim 8, wherein a boron doping in the source/drain epitaxial seed layer, a boron doping in the source/drain epitaxial bulk layer, and a boron doping in the source/drain epitaxial cap layer are formed by in-situ doping.

10. The method for manufacturing the source/drain epitaxial layer of the MOSFET on the FDSOI according to claim 9, wherein an operation pressure of the first epitaxial growth in step 3 is greater than an operation pressure of the epitaxial growth in step 5 during forming the source/drain epitaxial seed layer, the source/drain epitaxial bulk layer, and the source/drain epitaxial cap layer.

* * * * *